United States Patent
Xie et al.

(10) Patent No.: US 10,950,320 B2
(45) Date of Patent: Mar. 16, 2021

(54) SHIFT REGISTER UNIT, GATE DRIVING CIRCUIT, DISPLAY DEVICE AND DRIVING METHOD

(71) Applicants: Hefei Xinsheng Optoelectronics Technology Co., Ltd., Anhui (CN); BOE Technology Group Co., Ltd., Beijing (CN)

(72) Inventors: Yongxian Xie, Beijing (CN); Hui Wang, Beijing (CN); Yifeng Zou, Beijing (CN)

(73) Assignees: Hefei Xinsheng Optoelectronics Technology Co., Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/535,412

(22) Filed: Aug. 8, 2019

(65) Prior Publication Data

US 2020/0105357 A1    Apr. 2, 2020

(30) Foreign Application Priority Data

Sep. 28, 2018 (CN) .......................... 201811141165.5

(51) Int. Cl.
*G11C 19/28* (2006.01)
*G09G 3/20* (2006.01)

(52) U.S. Cl.
CPC ............... *G11C 19/28* (2013.01); *G09G 3/20* (2013.01); *G09G 2310/0286* (2013.01); *G09G 2320/0252* (2013.01)

(58) Field of Classification Search
CPC .. G11C 19/28; G09G 3/20; G09G 2310/0286; G09G 2320/0252; G09G 3/3677; G09G 2320/0219
See application file for complete search history.

(56) References Cited

U.S. PATENT DOCUMENTS

2016/0266700 A1* 9/2016 Ji .......................... G11C 19/287
2020/0027382 A1* 1/2020 Wang ....................... G09G 3/20

* cited by examiner

*Primary Examiner* — Rodney Amadiz
(74) *Attorney, Agent, or Firm* — Myers Bigel, P.A.

(57) ABSTRACT

A shift register unit including a first output circuit configured to transfer a clock signal at a clock signal terminal to a signal output terminal as an output signal in response to a first node being at an active potential, a second output circuit configured to transfer the clock signal at the clock signal terminal to a carry output terminal as a carry output signal in response to the first node being at the active potential, and a delay circuit configured to generate a delayed version of a carry input signal in response to the carry input signal at a carry input terminal being active, and to transfer an inactive voltage at a first voltage terminal to the signal output terminal in response to the delayed version of the carry input signal being active.

19 Claims, 8 Drawing Sheets

SHIFT REGISTER UNIT, GATE DRIVING CIRCUIT, DISPLAY DEVICE AND DRIVING METHOD

CROSS-REFERENCE TO RELATED APPLICATIONS

The present application claims the priority of Chinese Patent Application No. 201811141165.5, filed Sep. 28, 2018 with the Chinese Patent Office, the entire disclosure of which is hereby incorporated by reference.

TECHNICAL FIELD

The present disclosure relates to the field of display technologies, and in particular, to a shift register unit, a gate driving circuit, a display device, and a driving method.

BACKGROUND

Parasitic capacitance is inevitably present in a thin film transistor liquid crystal display (TFT-LCD). The parasitic capacitance may, for example, be due to storage capacitance (which is formed by overlapping of a pixel electrode and a common electrode line), liquid crystal capacitance (which is formed by overlapping of a pixel electrode and a common electrode), and/or an overlap capacitance (which is formed by overlapping of a gate and a source of a pixel transistor). Owing to the presence of the parasitic capacitance, a sudden change in a gate scan signal on a gate line affects the magnitude of a pixel voltage on a pixel electrode. For example, a high to low transition of the gate scan signal may pull the pixel voltage on the pixel electrode to change accordingly. This causes a change in the display brightness and hence a defect such as flicker of the display screen.

SUMMARY

According to some embodiments of the present disclosure, a shift register unit is provided, comprising: a signal input terminal configured to receive an input signal; a reset input terminal configured to receive a reset signal; a carry input terminal configured to receive a carry input signal; a clock signal terminal configured to receive a clock signal; a signal output terminal configured to output an output signal; a carry output terminal configured to output a carry output signal; a first voltage terminal configured to receive an inactive voltage; a second voltage terminal configured to receive an inactive voltage; a first output circuit configured to transfer the clock signal at the clock signal terminal to the signal output terminal as the output signal in response to a first node being at an active potential, wherein the first node is configured to be at the active potential in response to the input signal at the signal input terminal being active and to be at an inactive potential in response to the reset signal at the reset input terminal being active; a second output circuit configured to transfer the clock signal at the clock signal terminal to the carry output terminal as the carry output signal in response to the first node being at the active potential; and a delay circuit configured to generate a delayed version of the carry input signal in response to the carry input signal at the carry input terminal being active, and to transfer the inactive voltage at the first voltage terminal to the signal output terminal in response to the delayed version of the carry input signal being active.

In some embodiments, the shift register unit further comprises: a first input circuit configured to transfer the input signal at the signal input terminal to the first node in response to the input signal being active; and a second input circuit configured to transfer the inactive voltage at the second voltage terminal to the first node in response to the reset signal at the reset input terminal being active.

In some embodiments, the shift register unit further comprises: an initialization signal terminal configured to receive an initialization signal; and an initialization circuit configured to transfer the inactive voltage at the second voltage terminal to the first node in response to the initialization signal at the initialization signal terminal being active.

In some embodiments, the shift register unit further comprises a reset circuit configured to transfer the inactive voltage at the first voltage terminal to the signal output terminal in response to the reset signal at the reset input terminal being active.

In some embodiments, the shift register unit further comprises: a third voltage terminal configured to receive a first voltage signal; a first node control circuit configured to set a potential at a second node depending upon a potential at the first node, the first voltage signal at the third voltage terminal, and the inactive voltage at the second voltage terminal; a first voltage pull circuit configured to transfer the inactive voltage at the first voltage terminal to the signal output terminal in response to the potential at the second node being active; and a second voltage pull circuit configured to transfer the inactive voltage at the second voltage terminal to the carry output terminal in response to the potential at the second node being active.

In some embodiments, the shift register unit further comprises a first noise reduction circuit configured to transfer the inactive voltage at the second voltage terminal to the first node in response to the potential at the second node being active.

In some embodiments, the shift register unit further comprises: a fourth voltage terminal configured to receive a second voltage signal; a second node control circuit configured to set a potential at a third node depending upon the potential at the first node, the second voltage signal at the fourth voltage terminal, and the inactive voltage at the second voltage terminal; a third voltage pull circuit configured to transfer the inactive voltage at the first voltage terminal to the signal output terminal in response to the potential at the third node being active; and a fourth voltage pull circuit configured to transfer the inactive voltage at the second voltage terminal to the carry output terminal in response to the potential at the third node being active.

In some embodiments, the shift register unit further comprises a second noise reduction circuit configured to transfer the inactive voltage at the second voltage terminal to the first node in response to the potential at the third node being active.

In some embodiments, the first output circuit comprises: a first transistor comprising a gate connected to the first node, a first electrode connected to the clock signal terminal, and a second electrode connected to the signal output terminal; and a storage capacitor comprising a first terminal connected to the first node and a second terminal connected to the signal output terminal.

In some embodiments, the second output circuit comprises a second transistor comprising a gate connected to the first node, a first electrode connected to the clock signal terminal, and a second electrode connected to the carry output terminal.

In some embodiments, the delay circuit comprises a third transistor, a fourth transistor and a fifth transistor. The third transistor comprises a gate connected to the carry input terminal, a first electrode connected to a gate of the fourth transistor, and a second electrode connected to the carry input terminal. The fourth transistor comprises a gate connected to the first electrode of the third transistor, a first electrode connected to a gate of the fifth transistor, and a second electrode connected to the carry input terminal. The fifth transistor comprises a gate connected to the first electrode of the fourth transistor, a first electrode connected to the signal output terminal, and a second electrode connected to the first voltage terminal.

In some embodiments, the first input circuit comprises a sixth transistor comprising a gate connected to the signal input terminal, a first electrode connected to the signal input terminal, and a second electrode connected to the first node.

In some embodiments, the second input circuit comprises a seventh transistor comprising a gate connected to the reset input terminal, a first electrode connected to the first node, and a second electrode connected to the second voltage terminal.

In some embodiments, the initialization circuit comprises an eighth transistor comprising a gate connected to the initialization signal terminal, a first electrode connected to the first node, and a second electrode connected to the second voltage terminal.

In some embodiments, the reset circuit comprises a ninth transistor comprising a gate connected to the reset input terminal, a first electrode connected to the signal output terminal, and a second electrode connected to the first voltage terminal.

In some embodiments, the first node control circuit comprises a tenth transistor, an eleventh transistor, a twelfth transistor, and a thirteenth transistor. The tenth transistor comprises a gate connected to the third voltage terminal, a first electrode connected to the third voltage terminal, and a second electrode connected to a gate of the eleventh transistor. The eleventh transistor comprises a gate connected to the second electrode of the tenth transistor, a first electrode connected to the third voltage terminal, and a second electrode connected to the second node. The twelfth transistor comprises a gate connected to the first node, a first electrode connected to the gate of the eleventh transistor, and a second electrode connected to the second voltage terminal. The thirteenth transistor comprises a gate connected to the first node, a first electrode connected to the second node, and a second electrode connected to the second voltage terminal. The first voltage pull circuit comprises a fourteenth transistor comprising a gate connected to the second node, a first electrode connected to the signal output terminal, and a second electrode connected to the first voltage terminal. The second voltage pull circuit comprises a fifteenth transistor comprising a gate connected to the second node, a first electrode connected to the carry output terminal, and a second electrode connected to the second voltage terminal.

In some embodiments, the second node control circuit comprises a seventeenth transistor, an eighteenth transistor, a nineteenth transistor, and a twentieth transistor. The seventeenth transistor comprises a gate connected to the fourth voltage terminal, a first electrode connected to the fourth voltage terminal, and a second electrode connected to a gate of the eighteenth transistor. The eighteenth transistor comprises a gate connected to the second electrode of the seventeenth transistor, a first electrode connected to the fourth voltage terminal, and a second electrode connected to the third node. The nineteenth transistor comprises a gate connected to the first node, a first electrode connected to the gate of the eighteenth transistor, and a second electrode connected to the second voltage terminal. The twentieth transistor comprises a gate connected to the first node, a first electrode connected to the third node, and a second electrode connected to the second voltage terminal. The third voltage pull circuit comprises a twenty-first transistor comprising a gate connected to the third node, a first electrode connected to the signal output terminal, and a second electrode connected to the first voltage terminal. The fourth voltage pull circuit comprises a twenty-second transistor comprising a gate connected to the third node, a first electrode connected to the carry output terminal, and a second electrode connected to the second voltage terminal.

According to some embodiments of the present disclosure, a gate driving circuit is provided comprising N shift register units as recited above that are cascaded with each other, N being an integer greater than or equal to 4. The signal input terminals of a first one and a second one of the N shift register units are configured to receive a frame start pulse signal as the input signal. The carry output terminal and the reset input terminal of an i-th one of the N shift register units are respectively connected to the signal input terminal and the carry output terminal of an (i+2)-th one of the N shift register units, i being an integer, $1 \leq i \leq N-2$. The carry input terminal of a j-th one of the N shift register units is connected to the carry output terminal of a (j+1)-th one of the N shift register units, j being an integer, $1 \leq j \leq N-1$.

According to some embodiments of the present disclosure, a display device is provided comprising the gate driving circuit as described above.

According to some embodiments of the present disclosure, a method of driving a shift register unit is provided. The shift register unit comprises: a signal input terminal configured to receive an input signal; a reset input terminal configured to receive a reset signal; a carry input terminal configured to receive a carry input signal; a clock signal terminal configured to receive a clock signal; a signal output terminal configured to output an output signal; a carry output terminal configured to output a carry output signal; a first voltage terminal configured to receive an inactive voltage; a second voltage terminal configured to receive an inactive voltage; a first output circuit configured to transfer the clock signal at the clock signal terminal to the signal output terminal as the output signal in response to a first node being at an active potential, wherein the first node is configured to be at the active potential in response to the input signal at the signal input terminal being active and to be at an inactive potential in response to the reset signal at the reset input terminal being active; a second output circuit configured to transfer the clock signal at the clock signal terminal to the carry output terminal as the carry output signal in response to the first node being at the active potential; and a delay circuit configured to generate a delayed version of the carry input signal in response to the carry input signal at the carry input terminal being active, and to transfer the inactive voltage at the first voltage terminal to the signal output terminal in response to the delayed version of the carry input signal being active. The method comprises: responsive to the first node being at the active potential, transferring, by the first output circuit and the second output circuit, the clock signal at the clock signal terminal to the signal output terminal as the output signal, and to the carry output terminal as the carry output signal, wherein the carry output signal has a pulse width of 2H; responsive to the carry input signal at the carry input terminal being active, generating, by the delay circuit, a delayed version of the carry input signal, wherein the carry input signal has a pulse width of 2H and lags behind the carry output signal by 1H, and the delayed version of the carry input signal is delayed by a time interval less than 1H with respect to the carry input signal; and responsive to the delayed version of the carry input signal being active, transferring, by the delay circuit, the inactive voltage at the first voltage terminal to the signal output terminal.

BRIEF DESCRIPTION OF THE DRAWINGS

Further details, features and advantages of the present disclosure are disclosed in the following description of exemplary embodiments in conjunction with the accompanying drawings in which.

DETAILED DESCRIPTION

Figure 1:
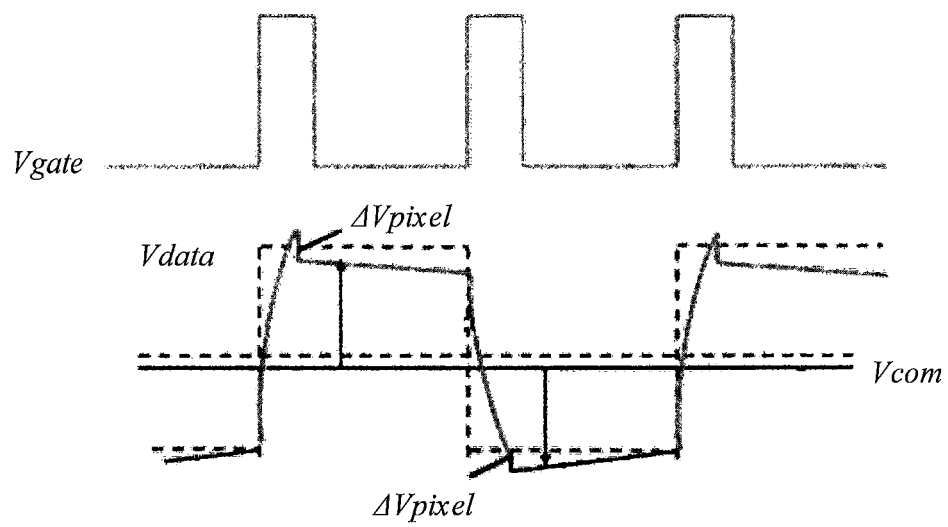
FIG. 1 is a schematic diagram illustrating a pulling effect of a gate scan signal on a voltage on a pixel electrode.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another. Thus, a first element, component, region, layer or section discussed below could be termed a second element, component, region, layer or section without departing from the teachings of the present disclosure.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. Terms such as "before" or "preceding" and "after" or "followed by" may be similarly used, for example, to indicate an order in which light passes through the elements. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present. In no event, however, should "on" or "directly on" be construed as requiring a layer to completely cover an underlying layer.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 schematically illustrates a pulling effect of a gate scan signal on a voltage on a pixel electrode. Referring to FIG. 1, Vcom represents a voltage on a common electrode, Vgate represents a gate scan signal on a gate line, and Vdata represents a voltage on a pixel electrode, i.e., a pixel voltage. Due to the parasitic capacitance, the transition of the gate scan signal Vgate causes a change ΔVpixel in the pixel voltage Vdata on the pixel electrode, resulting in defects such as flicker of the display image. Therefore, it would be desirable to suppress or eliminate such a change ΔVpixel in the pixel voltage Vdata.

Figure 2:
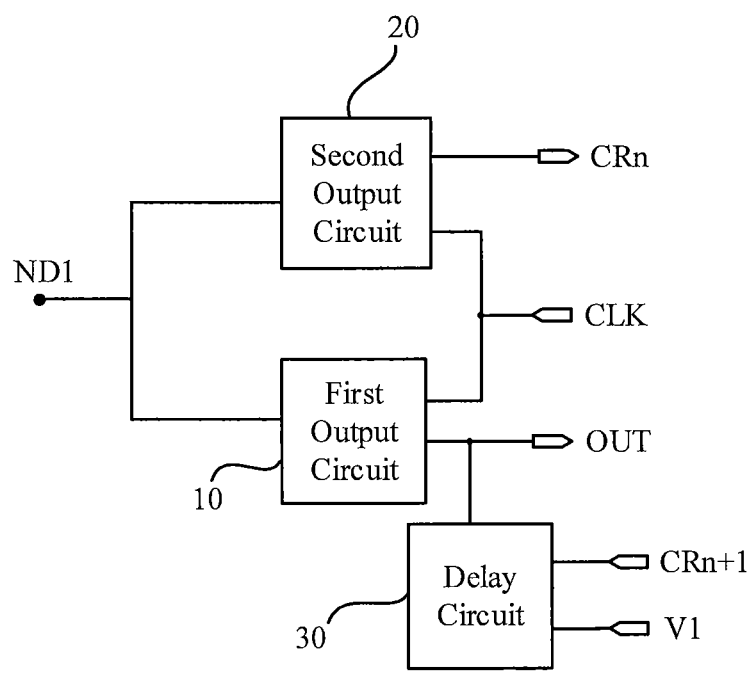
FIG. 2 is a schematic block diagram of a shift register unit in accordance with an embodiment of the present disclosure.

FIG. 2 is a schematic block diagram of a shift register unit in accordance with an embodiment of the present disclosure.

As shown in FIG. 2, the shift register unit includes a first node ND1, a first output circuit 10, a second output circuit 20, and a delay circuit 30.

The first output circuit 10 is configured to transfer a clock signal at a clock signal terminal CLK to a signal output terminal OUT as an output signal in response to the first node ND1 being at an active potential. In the case of a gate driving circuit, the output signal can be used as a gate scan signal.

The second output circuit 20 is configured to transfer the clock signal at the clock signal terminal CLK to a carry output terminal CRn as a carry output signal in response to the first node ND1 being at the active potential. In the case of the gate driving circuit, the carry output signal can be supplied to the next shift register unit as an input signal.

The delay circuit 30 is configured to generate a delayed version of a carry input signal in response to the carry input signal at a carry input terminal CRn+1 being active, and to transfer an inactive voltage at a first voltage terminal V1 to the signal output terminal OUT in response to the delayed version of the carry input signal being active.

As will be described in detail later, this allows the output signal at the signal output terminal OUT to be pulled toward an inactive potential in advance, thereby modifying ("chamfering") the waveform of the output signal. Moreover, due to the delay effect of the delay circuit 30, the inactive voltage at the first voltage terminal V1 is transferred to the signal output terminal OUT later than otherwise, so that the output signal is only modified at the end of the time interval in which it is active. In the case of the gate driving circuit, this can suppress or eliminate the change in the pixel voltage due to the transition of the output signal (the "gate scan signal") without affecting the charging rate of the pixel electrode.

Furthermore, the modification of the waveform of the output signal does not affect the waveform of the carry output signal because the output signal and the carry output signal are output by the first output circuit 10 and the second output circuit 20, respectively. As a result, in the case of the gate driving circuit, the modification of the waveform of the output signal does not affect the operation of the next shift register unit.

The term "active potential" or "effective voltage" as used herein refers to a potential at which the circuit component (e.g., a transistor) involved is enabled, and the term "inactive potential" or "inactive voltage" as used herein refers to a potential at which the circuit component involved is disabled. For an N-type transistor, the active potential is high and the inactive potential is low. For a P-type transistor, the active potential is low and the inactive potential is high. It will be understood that the active potential or inactive potential is not intended to refer to a specific potential, but may include a range of potentials. Additionally, the term "voltage" is intended to be used interchangeably with "potential".

Figure 3:
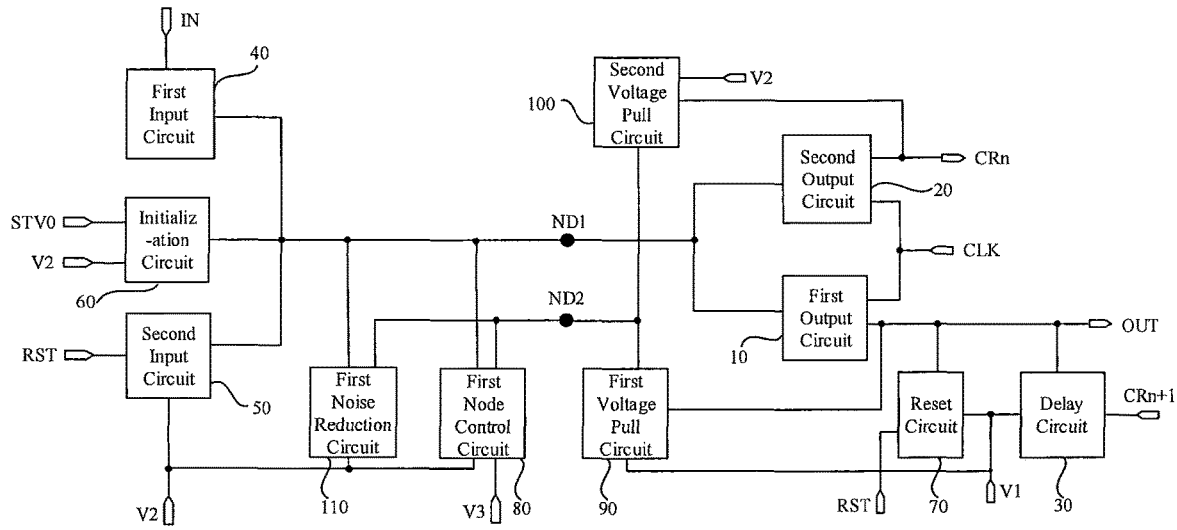
FIG. 3 is a schematic block diagram of a shift register unit in accordance with an embodiment of the present disclosure.

FIG. 3 is a schematic block diagram of a shift register unit in accordance with an embodiment of the present disclosure. The same elements as those shown in FIG. 2 are denoted by the same reference signs.

As shown in FIG. 3, the shift register unit further includes a first input circuit 40 and a second input circuit 50. The first input circuit 40 is configured to transfer an input signal at a signal input terminal IN to the first node ND1 in response to the input signal being active. The second input circuit 50 is configured to transfer an inactive voltage at a second voltage terminal V2 to the first node ND1 in response to a reset signal at a reset input terminal RST being active.

Alternatively or additionally, as shown in FIG. 3, the shift register unit further includes an initialization circuit 60. The initialization circuit 60 is configured to transfer the inactive voltage at the second voltage terminal V2 to the first node ND1 in response to an initialization signal at an initialization signal terminal STV0 being active.

Alternatively or additionally, as shown in FIG. 3, the shift register unit further includes a reset circuit 70. The reset circuit 70 is configured to transfer the inactive voltage at the first voltage terminal V1 to the signal output terminal OUT in response to the reset signal at the reset input terminal RST being active.

Alternatively or additionally, as shown in FIG. 3, the shift register unit further includes a first node control circuit 80, a first voltage pull circuit 90, and a second voltage pull circuit 100. The first node control circuit 80 is configured to set a potential at a second node ND2 depending upon a potential at the first node ND1, a first voltage signal at a third voltage terminal V3, and the inactive voltage at the second voltage terminal V2. The first voltage pull circuit 90 is configured to transfer the inactive voltage at the first voltage terminal V1 to the signal output terminal OUT in response to the potential at the second node ND2 being active. The second voltage pull circuit 100 is configured to transfer the inactive voltage at the second voltage terminal V2 to the carry output terminal CRn in response to the potential at the second node ND2 being active. In some embodiments, the shift register unit further includes a first noise reduction circuit 110. The first noise reduction circuit 110 is configured to transfer the inactive voltage at the second voltage terminal V2 to the first node ND1 in response to the potential at the second node ND2 being active.

Figure 4:
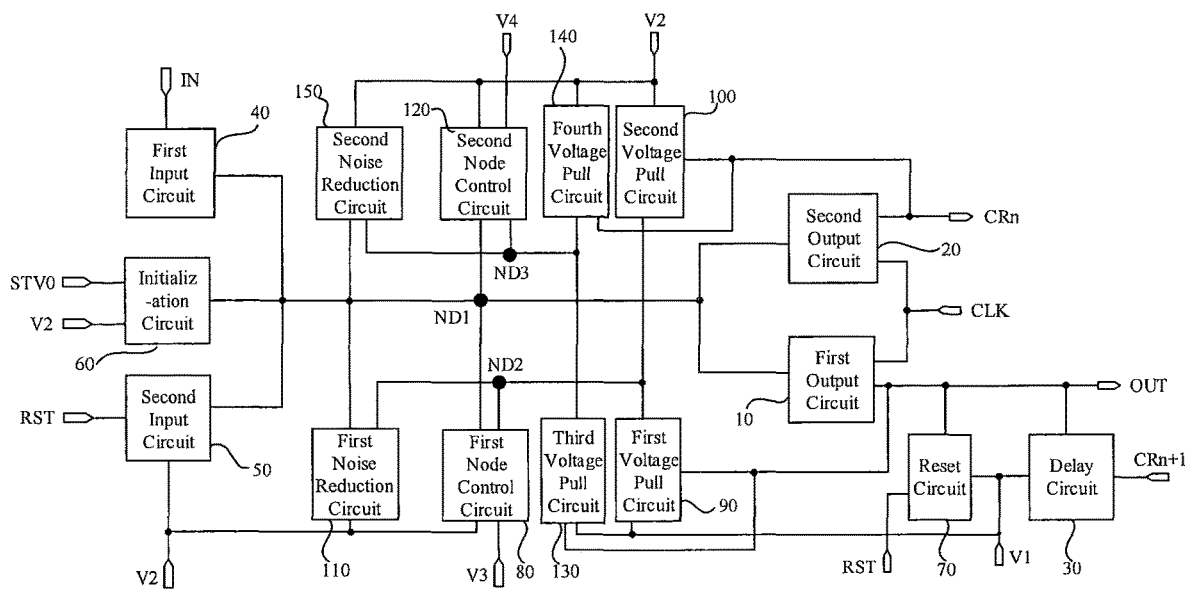
FIG. 4 is a schematic block diagram of a shift register unit in accordance with an embodiment of the present disclosure.

FIG. 4 is a schematic block diagram of a shift register unit in accordance with an embodiment of the present disclosure. The same elements as those shown in FIG. 3 are denoted by the same reference signs.

As shown in FIG. 4, the shift register unit further includes a second node control circuit 120, a third voltage pull circuit 130, and a fourth voltage pull circuit 140. The second node control circuit 120 is configured to set a potential at a third node ND3 depending upon the potential at the first node ND1, a second voltage signal at a fourth voltage terminal V4, and the inactive voltage at the second voltage terminal V2. The third voltage pull circuit 130 is configured to transfer the inactive voltage at the first voltage terminal V1 to the signal output terminal OUT in response to the potential at the third node ND3 being active. The fourth voltage pull circuit 140 is configured to transfer the inactive voltage at the second voltage terminal V2 to the carry output terminal CRn in response to the potential at the third node ND3 being active. In some embodiments, the shift register unit further includes a second noise reduction circuit 150. The second noise reduction circuit 150 is configured to transfer the inactive voltage at the second voltage terminal V2 to the first node ND1 in response to the potential at the third node ND3 being active.

Figure 5:
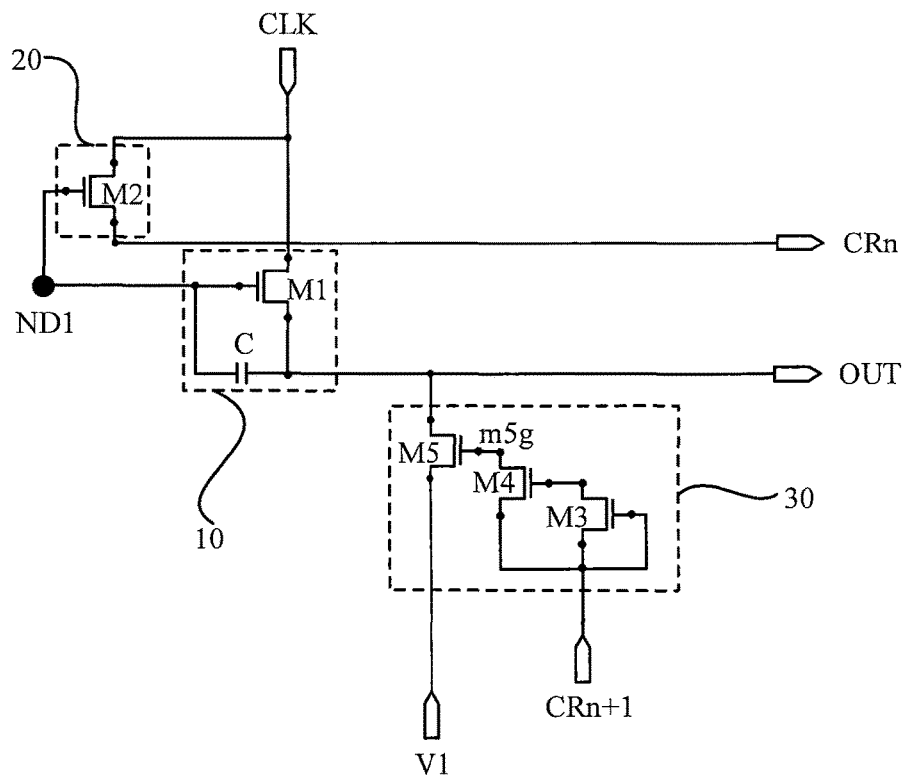
FIG. 5 is an example circuit diagram of the shift register unit of FIG. 2.

FIG. 5 is an example circuit diagram of the shift register unit of FIG. 2. The same elements as those shown in FIG. 2 are denoted by the same reference signs.

As shown in FIG. 5, the first output circuit 10 includes a first transistor M1 and a storage capacitor C. The first transistor M1 includes a gate connected to the first node ND1, a first electrode connected to the clock signal terminal CLK, and a second electrode connected to the signal output terminal OUT. The storage capacitor C includes a first terminal connected to the first node ND1 and a second terminal connected to the signal output terminal OUT.

The second output circuit 20 includes a second transistor M2. The second transistor M2 includes a gate connected to the first node ND1, a first electrode connected to the clock signal terminal CLK, and a second electrode connected to the carry output terminal CRn.

The delay circuit 30 includes a third transistor M3, a fourth transistor M4, and a fifth transistor M5. The third transistor M3 includes a gate connected to the carry input terminal CRn+1, a first electrode connected to a gate of the fourth transistor M4, and a second electrode connected to the carry input terminal CRn+1. The fourth transistor M4 includes a gate connected to the first electrode of the third transistor M3, a first electrode connected to a gate m5g of the fifth transistor M5, and a second electrode connected to the carry input terminal CRn+1. The fifth transistor M5 includes a gate m5g connected to the first electrode of the fourth transistor M4, a first electrode connected to the signal output terminal OUT, and a second electrode connected to the first voltage terminal V1.

By designing the sizes of the third transistor M3 and the fourth transistor M4, a delayed version of the carry input signal received at the carry input terminal CRn+1 can be generated at the gate m5g of the fifth transistor M5. For example, the third transistor M3 and the fourth transistor M4 may be designed to have a size (e.g., a channel width-to-length ratio) smaller than that of the fifth transistor M5 such that the current flowing through the third transistor M3 and the fourth transistor M4 when they are turned on is relatively small and, in turn, the charging of the gate m5g of the fifth transistor M5 is relatively slow. This allows the third transistor M3 and the fourth transistor M4 to have such a delay effect that the active potential of the carry input signal received at the carry input terminal CRn+1 is transferred to the gate m5g of the fifth transistor M5 later than the case where the carry input signal is directly supplied to the gate m5g of the fifth transistor M5. This can in turn cause the output signal at the signal output terminal OUT to be modified ("chamfered") at the end of the time interval in which it is active. The third transistor M3 and the fourth transistor M4 (and potentially the fifth transistor M5) can be designed to have an appropriate channel width-to-length ratio such that the delay circuit 30 provides an appropriate delay effect.

Figure 6:
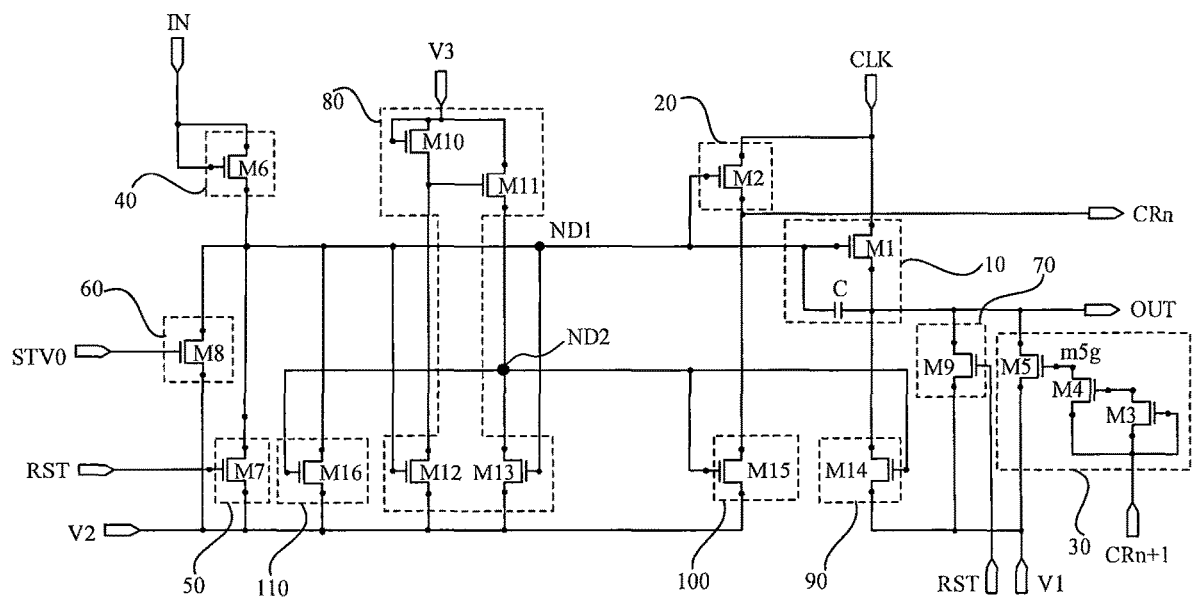
FIG. 6 is an example circuit diagram of the shift register unit of FIG. 3.

FIG. 6 is an example circuit diagram of the shift register unit of FIG. 3. The same elements as those shown in FIGS. 3 and 5 are denoted by the same reference signs.

As shown in FIG. 6, the first input circuit 40 includes a sixth transistor M6. The sixth transistor M6 includes a gate connected to the signal input terminal IN, a first electrode connected to the signal input terminal IN, and a second electrode connected to the first node ND1.

The second input circuit 50 includes a seventh transistor M7. The seventh transistor M7 includes a gate connected to the reset input terminal RST, a first electrode connected to the first node ND1, and a second electrode connected to the second voltage terminal V2.

The initialization circuit 60 includes an eighth transistor M8. The eighth transistor M8 includes a gate connected to the initialization signal terminal STV0, a first electrode connected to the first node ND1, and a second electrode connected to the second voltage terminal V2.

The reset circuit 70 includes a ninth transistor M9. The ninth transistor M9 includes a gate connected to the reset input terminal RST, a first electrode connected to the signal output terminal OUT, and a second electrode connected to the first voltage terminal V1.

The first node control circuit 80 includes a tenth transistor M10, an eleventh transistor M11, a twelfth transistor M12, and a thirteenth transistor M13. The tenth transistor M10 includes a gate connected to the third voltage terminal V3, a first electrode connected to the third voltage terminal V3, and a second electrode connected to a gate of the eleventh transistor M11. The eleventh transistor M11 includes a gate connected to the second electrode of the tenth transistor M10, a first electrode connected to the third voltage terminal V3, and a second electrode connected to the second node ND2. The twelfth transistor M12 includes a gate connected to the first node ND1, a first electrode connected to a gate of the eleventh transistor M11, and a second electrode connected to the second voltage terminal V2. The thirteenth transistor M13 includes a gate connected to the first node ND1, a first electrode connected to the second node ND2, and a second electrode connected to the second voltage terminal V2.

The first voltage pull circuit 90 includes a fourteenth transistor M14. The fourteenth transistor M14 includes a gate connected to the second node ND2, a first electrode connected to the signal output terminal OUT, and a second electrode connected to the first voltage terminal V1.

The second voltage pull circuit 100 includes a fifteenth transistor M15. The fifteenth transistor M15 includes a gate connected to the second node ND2, a first electrode connected to the carry output terminal CRn, and a second electrode connected to the second voltage terminal V2.

The first noise reduction circuit 110 includes a sixteenth transistor M16. The sixteenth transistor M16 includes a gate connected to the second node ND2, a first electrode connected to the first node ND1, and a second electrode connected to the second voltage terminal V2.

In some embodiments, the first node control circuit 80 may operate in a DC mode where the first voltage signal at the third voltage terminal V3 is a DC active voltage. In some embodiments, the first node control circuit 80 may operate in an AC mode where the first voltage signal at the third voltage terminal V3 is an alternating voltage having, for example, a polarity opposite to that of the clock signal at the clock signal terminal CLK.

Figure 7:
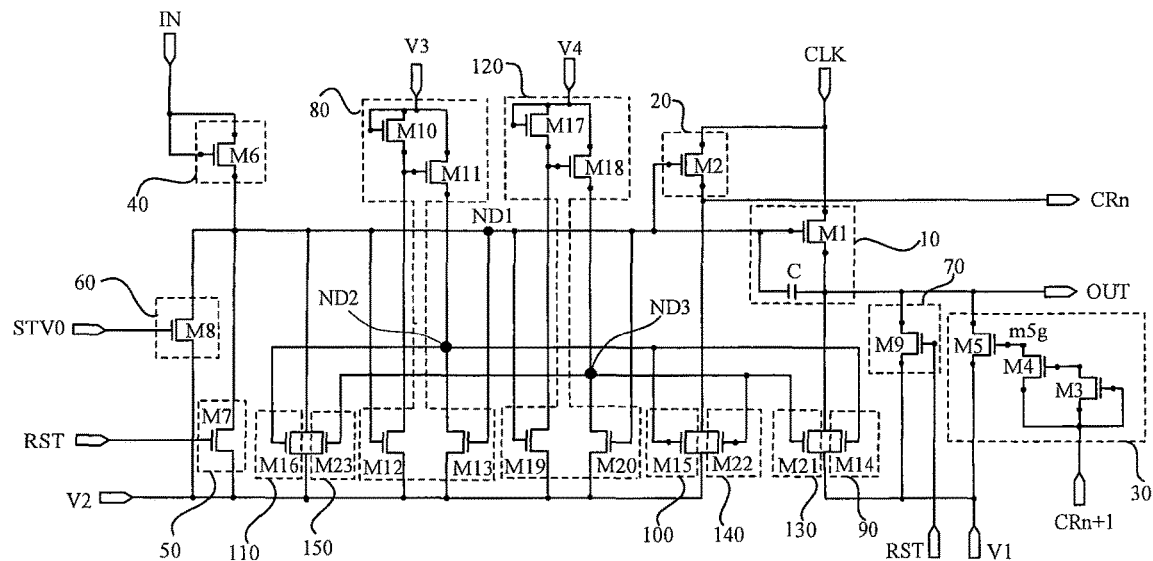
FIG. 7 is an example circuit diagram of the shift register unit of FIG. 4.

FIG. 7 is an example circuit diagram of the shift register unit of FIG. 4. The same elements as those shown in FIGS. 4 and 6 are denoted by the same reference signs.

As shown in FIG. 7, the second node control circuit 120 includes a seventeenth transistor M17, an eighteenth transistor M18, a nineteenth transistor M19, and a twentieth transistor M20. The seventeenth transistor M17 includes a gate connected to the fourth voltage terminal V4, a first electrode connected to the fourth voltage terminal V4, and a second electrode connected to a gate of the eighteenth transistor M18. The eighteenth transistor M18 includes a gate connected to the second electrode of the seventeenth transistor M17, a first electrode connected to the fourth voltage terminal V4, and a second electrode connected to the third node ND3. The nineteenth transistor M19 includes a gate connected to the first node ND1, a first electrode connected to the gate of the eighteenth transistor M18, and a second electrode connected to the second voltage terminal V2. The twentieth transistor M20 includes a gate connected to the first node ND1, a first electrode connected to the third node ND3, and a second electrode connected to the second voltage terminal V2.

The third voltage pull circuit 130 includes a twenty-first transistor M21. The twenty-first transistor M21 includes a gate connected to the third node ND3, a first electrode connected to the signal output terminal OUT, and a second electrode connected to the first voltage terminal V1.

The fourth voltage pull circuit 140 includes a twenty-second transistor M22. The twenty-second transistor M22 includes a gate connected to the third node ND3, a first electrode connected to the carry output terminal CRn, and a second electrode connected to the second voltage terminal V2.

The second noise reduction circuit 150 includes a twenty-third transistor M23. The twenty-third transistor M23 includes a gate connected to the third node ND3, a first electrode connected to the first node ND1, and a second electrode connected to the second voltage terminal V2.

In some embodiments, the first and second node control circuits 80 and 120 may operate in a DC mode where the first voltage signal at the third voltage terminal V3 and the second voltage signal at the fourth voltage terminal V4 are DC active voltages. In some embodiments, the first and second node control circuits 80 and 120 may operate in an AC mode where the first voltage signal at the third voltage terminal V3 and the second voltage signal at the fourth voltage terminal V4 are AC voltages and have opposite polarities to each other. In this way, the first and second node control circuits 80 and 120 operate alternately, thereby preventing the gates of the transistors in the first and second node control circuits 80 and 120 from being biased for a long period of time, reducing the drift of the threshold voltage.

In embodiments, although the transistors are illustrated and described as N-type transistors, P-type transistors are possible. In the case of a P-type transistor, the active voltage has a low level, and the inactive voltage has a high level. In embodiments, the transistors may take the form of, for example, thin film transistors, which are typically fabricated such that their first and second electrodes are used interchangeably. Further, the first voltage terminal V1 and the second voltage terminal V2 may be supplied with respective inactive voltages by different voltage sources, or they may be supplied with the same inactive voltage by the same voltage source. In the latter case, the first voltage terminal V1 and the second voltage terminal V2 may be considered as the same terminal.

Taking the transistors being N-type transistors as an example, the operation of the shift register unit shown in FIG. 7 will be described below in conjunction with the timing diagram shown in FIG. 8. In this embodiment, the first voltage signal at the third voltage terminal V3 and the second voltage signal at the fourth voltage terminal V4 are alternating voltages having opposite polarities.

In an initial phase P0, STV0=1, and all other signals are 0. Here "0" indicates a low level and "1" indicates a high level.

The eighth transistor M8 transfers the low level voltage at the second voltage terminal V2 to the first node ND1 to initialize the first node ND1.

In a first phase P1, IN=1, RST=0, STV0=0, CLK=0, CRn+1=0.

The sixth transistor M6 transfers the high level input signal at the signal input terminal IN to the first node ND1 to charge the storage capacitor C, and the first node ND1 is at a high potential. The first transistor M1 is turned on to transfer the low-level clock signal at the clock signal terminal CLK to the signal output terminal OUT. The second transistor M2 is turned on to transfer the low-level clock signal at the clock signal terminal CLK to the carry output terminal CRn.

In the case where V3=1 and V4=0, since the first node ND1 is at a high potential, the twelfth transistor M12 is turned on, and the low-level voltage at the second voltage terminal V2 is transferred to the gate of the eleventh transistor M11. In response to the high level voltage at the third voltage terminal V3, the tenth transistor M10 is turned on, and the high level voltage at the third voltage terminal V3 is transferred to the gate of the eleventh transistor M11. The channel width-to-length ratio of the twelfth transistor M12 is smaller than that of the tenth transistor M10, so that the gate of the eleventh transistor M11 is still at the active potential and the eleventh transistor M11 is turned on. In response to the high potential at the first node ND1, the thirteenth transistor M13 is turned on, and the low-level voltage at the second voltage terminal V2 is transferred to the second node ND2. The eleventh transistor M11 transfers the high-level voltage at the third voltage terminal V3 to the second node ND2. The channel width-to-length ratio of the thirteenth transistor M13 is larger than that of the eleventh transistor M11, so that the second node ND2 is at a low potential. The seventeenth transistor M17 is turned off in response to the low level voltage at the fourth voltage terminal V4. Since the first node ND1 is at a high potential, the nineteenth transistor M19 is turned on, and the low level voltage at the second voltage terminal V2 is transferred to the gate of the eighteenth transistor M18 to control the eighteenth transistor M18 to be turned off. The twentieth transistor M20 is also turned on, and the low-level voltage at the second voltage terminal V2 is transferred to the third node ND3, setting the third node ND3 at a low potential. In this case, the third transistor M3, the fourth transistor M4, the fifth transistor M5, the seventh transistor M7, the ninth transistor M9, the fourteenth transistor M14, the fifteenth transistor M15, and the sixteenth transistor M16 are in an off state.

In the case where V3=0 and V4=1, since the first node ND1 is at a high potential, the nineteenth transistor M19 is turned on, and the low-level voltage at the second voltage terminal V2 is transferred to the gate of the eighteenth transistor M18. In response to the high-level voltage at the third voltage terminal V3, the seventeenth transistor M17 is turned on, and the high-level voltage at the third voltage terminal V3 is transferred to the gate of the eighteenth transistor M18. The channel width-to-length ratio of the nineteenth transistor M19 is smaller than that of the seventeenth transistor M17, so that the gate of the eighteenth transistor M18 is still at the active potential and the eighteenth transistor M18 is turned on. In response to the high potential at the first node ND1, the twentieth transistor M20 is turned on, and the low-level voltage at the second voltage terminal V2 is transferred to the third node ND3. The channel width-to-length ratio of the twentieth transistor M20 is larger than that of the eighteenth transistor M18 channel, so that the third node ND3 is at a low potential. The tenth transistor M10 is turned off in response to the low-level voltage at the third voltage terminal V3. Since the first node ND1 is at a high potential, the twelfth transistor M12 is turned on, and the low-level voltage at the second voltage terminal V2 is transferred to the gate of the eleventh transistor M11 to control the eleventh transistor M11 to be turned off. The thirteenth transistor M13 is also turned on, and the low-level voltage at the second voltage terminal V2 is transferred to the second node ND2, setting the second node ND2 at a low potential. In this case, the third transistor M3, the fourth transistor M4, the fifth transistor M5, the seventh transistor M7, the ninth transistor M9, the twenty-first transistor M21, the twenty-second transistor M22, and the twenty-third transistor M23 are all in an off state.

In a second phase P2, IN=0, RST=0, STV0=0, CLK=1.

Since the signal input terminal IN is at a low level, the sixth transistor M6 is in an off state. The storage capacitor C maintains the first node ND1 at a high potential, thereby keeping the first transistor M1 and the second transistor M2 in an on state. At this time, the high-level clock signal at the clock signal terminal CLK is transferred to the signal output terminal OUT as an output signal through the first transistor M1, and is transferred to the carry output terminal CRn as a carry output signal through the second transistor M2. Since the signal output terminal OUT transitions from a low level to a high level, the potential at the first node ND1 is further raised due to a self-boosting effect of the storage capacitor C, thereby maintaining the first transistor M1 and the second transistor M2 in an on state. The high-level clock signal at the clock signal terminal CLK continues to be transferred to the signal output terminal OUT and the carry output terminal CRn. In this example, the clock signal has a 50% duty cycle, and is specifically a square wave having a pulse width of 2H.

Then, a carry input signal of a high level is received at the carry input terminal CRn+1. In this example, the carry input signal has a pulse width of 2H and lags behind the carry output signal at the carry output terminal CRn by 1H. The delay circuit 30 generates a delayed version of the carry input signal at the gate m5g of the fifth transistor M5 as previously described, and transfers the low-level voltage at the first voltage terminal V1 to the signal output terminal OUT in response to the delayed carry input signal. This causes the output signal output from the signal output terminal OUT to be pulled low ("chamfered") at the end of the second phase P2. Depending upon the sizes of the transistors in the delay circuit 30, the delayed version of the carry input signal is delayed by a time interval of less than 1H relative to the carry input signal, as shown in FIG. 8

In a third phase P3, IN=0, RST=1, STV0=0, CLK=1.

Since the reset input terminal RST is at a high level, the seventh transistor M7 is turned on, pulling down the potential at the first node ND1 to the low level of the second voltage terminal V2. The ninth transistor M9 is also turned on, pulling down the potential of the signal output terminal OUT to the low level of the second voltage terminal V2.

In the case where V3=1 and V4=0, since the first node ND1 is at a low potential, the twelfth transistor M12 and the thirteenth transistor M13 are turned off. In response to the high-level voltage at the third voltage terminal V3, the tenth transistor M10 is turned on and controls the eleventh transistor M11 to be turned on. The high-level voltage at the third voltage terminal V3 is transferred to the second node ND2 such that the second node ND2 is at a high potential. The fourteenth transistor M14, the fifteenth transistor M15, and the sixteenth transistor M16 are all turned on. The potential of the signal output terminal OUT is pulled down to the low level of the first voltage terminal V1 through the fourteenth transistor M14, the potential of the carry output terminal CRn is pulled down to the low level of the second voltage terminal V2 through the fifteenth transistor M15, and the potential of the first node ND1 is pulled down to the low level of the second voltage terminal V2 through the sixteenth transistor M16.

In the case where V3=0 and V4=1, since the first node ND1 is at a low potential, the nineteenth transistor M19 and the twentieth transistor M20 are turned off. In response to the high-level voltage at the fourth voltage terminal V4, the seventeenth transistor M17 is turned on and controls the eighteenth transistor M18 to be turned on. The high-level voltage at the fourth voltage terminal V4 is output to the third node ND3 such that the third node ND3 is at a high potential. The twenty-first transistor M21, the twenty-second transistor M22, and the twenty-third transistor M23 are all turned on. The potential of the signal output terminal OUT is pulled down to the low level of the first voltage terminal V1 through the twenty-first transistor M21, the potential of the carry output terminal CRn is pulled down to the low level of the second voltage terminal V2 through the twenty-second transistor M22t, and the potential of the first node ND1 is pulled down to the low level of the second voltage terminal V2 through the sixteenth transistor M16.

Figure 8:
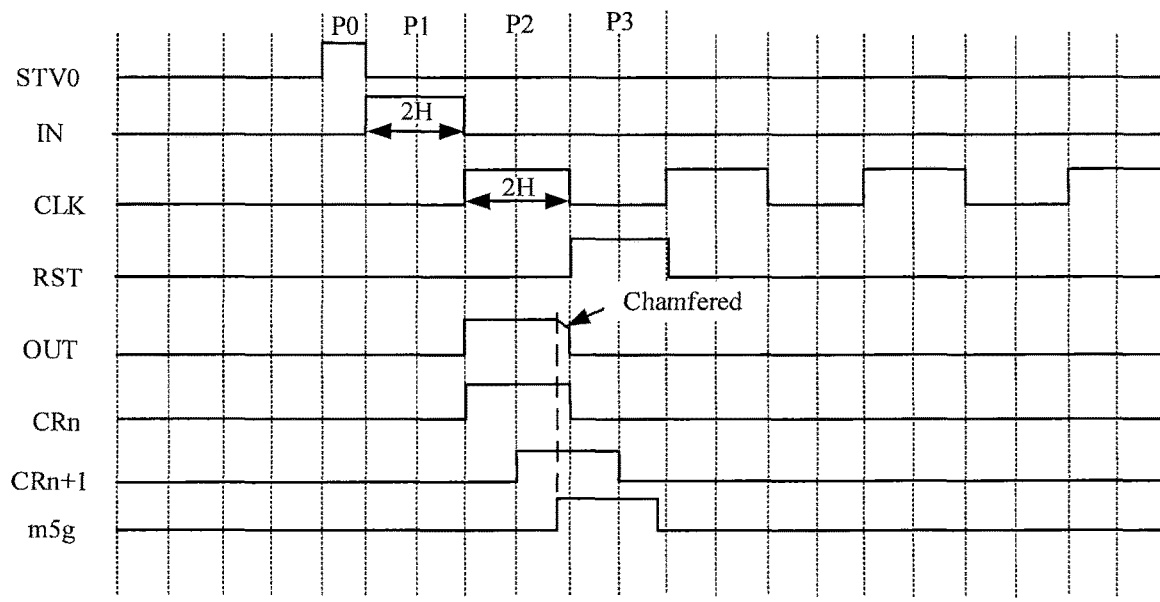
FIG. 8 is an example timing diagram for the shift register unit of FIG. 7.
Figure 9:
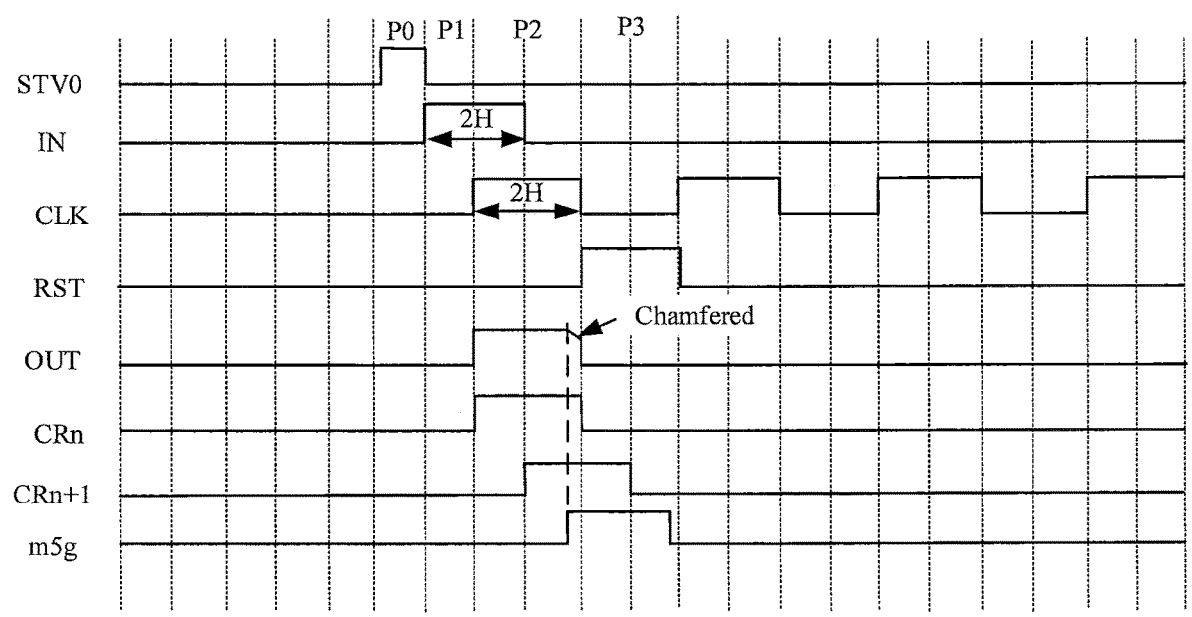
FIG. 9 is another example timing diagram for the shift register unit of FIG. 7.

The shift register unit of FIG. 7 may alternatively operate in accordance with the timing shown in FIG. 9. The timing of FIG. 9 differs from the timing of FIG. 8 in that the signals at the terminals CLK, OUT, and CRn lag behind the input signal at the signal input terminal IN by 1H instead of 2H as in FIG. 8. For the sake of brevity, the operation of the shift register unit following the timing of FIG. 9 is not described herein in detail.

Figure 10:
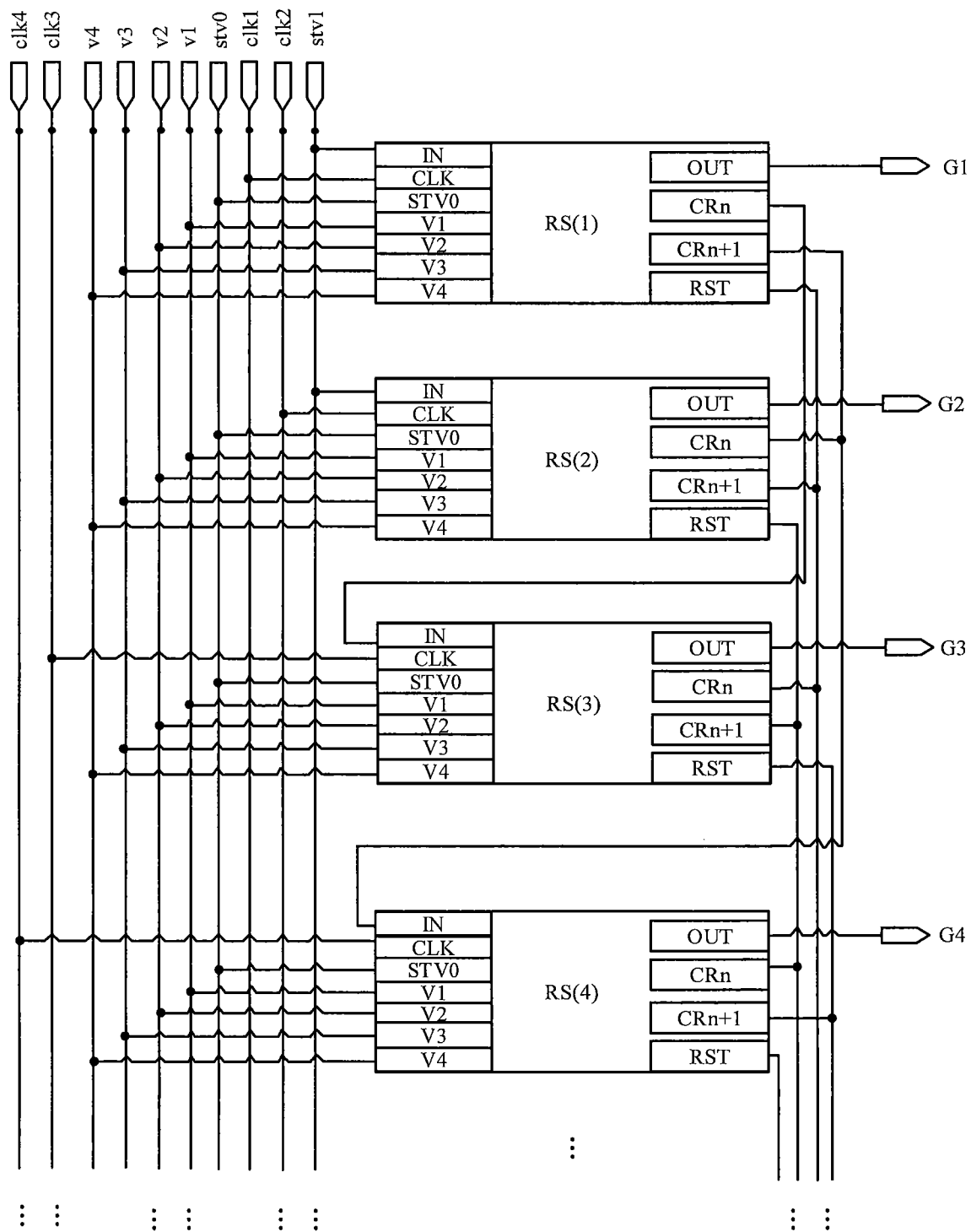
FIG. 10 is a schematic block diagram of a gate driving circuit in accordance with an embodiment of the present disclosure.

FIG. 10 is a schematic block diagram of a gate driving circuit in accordance with an embodiment of the present disclosure.

As shown in FIG. 10, the gate driving circuit includes N shift register units RS(1), RS(2), RS(3), RS(4), . . . which are cascaded with each other, where N is an integer greater than or equal to 4. These shift register units may take the form of any of the shift register unit embodiments described above.

The signal output terminals OUT of the shift register units RS(1), RS(2), RS(3), RS(4), . . . are respectively connected to the gate lines G1, G2, G3, G4, . . . , so as to sequentially supply gate scan signals to the gate lines.

The signal input terminals of the first one and second one of the shift register units are configured to receive a frame start pulse signal as the input signal. In the example of FIG. 10, the signal input terminals IN of the shift register units RS(1) and RS(2) are configured to receive a frame start pulse signal stv1.

The carry output terminal and the reset input terminal of the i-th one of the shift register units are respectively connected to the signal input terminal and the carry output terminal of the (i+2)-th one of the shift register units, where i is an integer, 1≤i≤N−2. For example, the carry output terminal CRn and the reset input terminal RST of the shift register unit RS(1) are respectively connected to the signal input terminal IN and the carry output terminal CRn of the shift register unit RS(3).

The carry input terminal of the j-th one of the shift register units is connected to the carry output terminal of the (j+1)-th one of the shift register units, where j is an integer, 1≤j≤N−1. For example, the carry input terminal CRn+1 of the shift register unit RS(1) is connected to the carry output terminal CRn of the shift register unit RS(2).

The clock signal terminals of the (4n+1)-th one, the (4n+2)-th one, the (4n+3)-th one, and the (4n+4) one of the shift register units are configured to respectively receive first, second, third, and fourth clock signals, where n is an integer greater than or equal to 0. For example, the clock signal terminals CLK of the shift register units RS(1), RS(2), RS(3), and RS(4) receive the clock signals clk1, clk2, clk3, and clk4, respectively, as shown in FIG. 10.

The first, second, third, and fourth voltage terminals V1, V2, V3, and V4 of each shift register unit are configured to receive first, second, third, and fourth voltage signals v1, v2, v3, and v4, respectively. In addition, the initialization signal terminal STV0 of each shift register unit is configured to receive the same initialization signal stv0.

Figure 11:
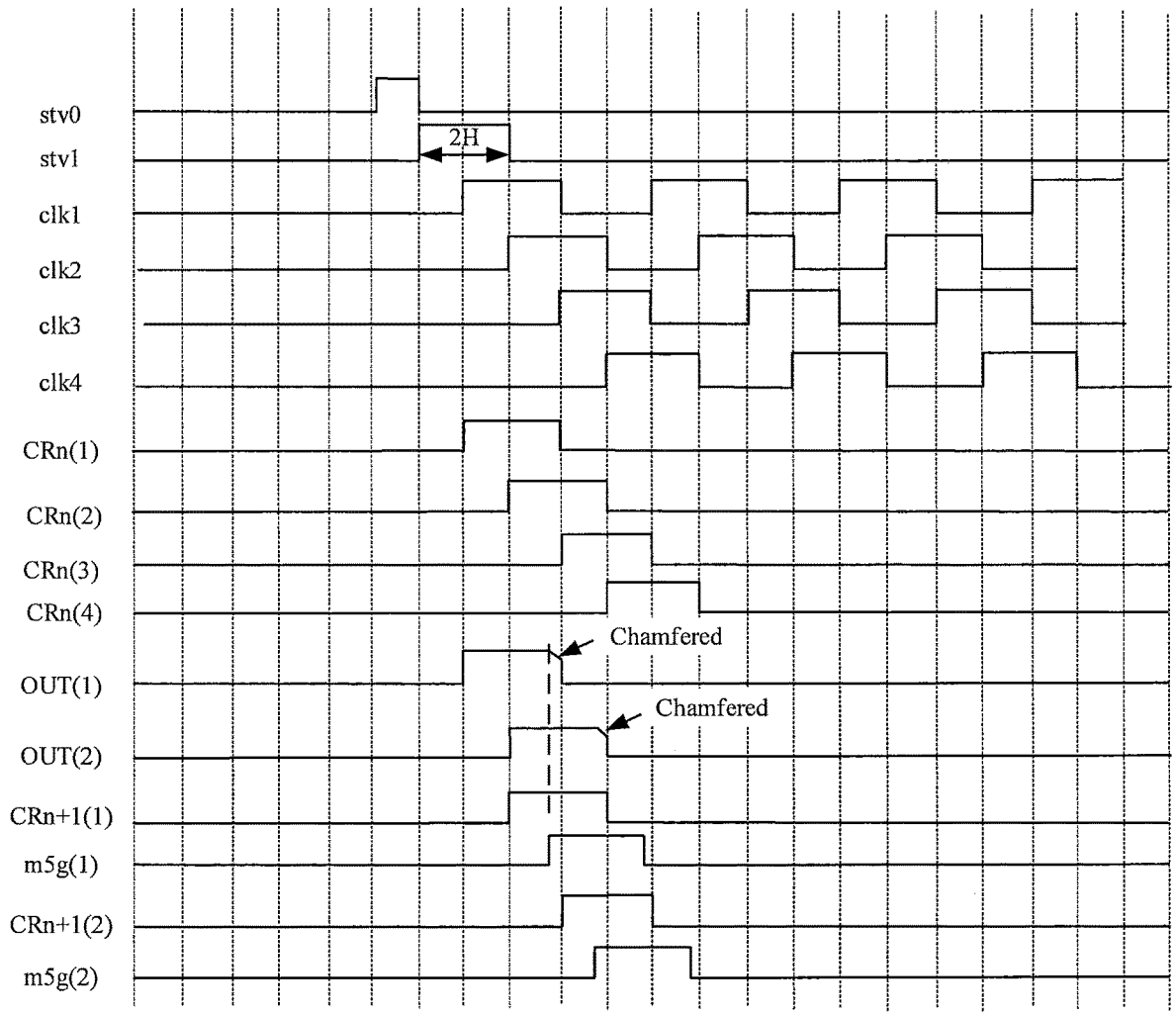
FIG. 11 is an example timing diagram for the gate driving circuit of FIG. 10.

FIG. 11 is an example timing diagram for the gate driving circuit of FIG. 10.

Referring to FIG. 11, under the excitation of the initialization signal stv0, the frame start pulse signal stv1, and the clock signals clk1, clk2, clk3, and clk4, the respective shift register units in the gate driving circuit operate to generate respective output signals and carry output signals. FIG. 11 exemplarily shows carry output signals CRn(1), CRn(2), CRn(3), and CRn(4) of the shift register units RS(1), RS(2), RS(3), and RS(4), output signals OUT(1) and OUT(2) of the shift register units RS(1) and RS(2), carry input signals CRn+1(1) (i.e., CRn(2)) and CRn+1(2) (i.e., CRn(3)) of the shift register units RS(1) and RS(2). Gate signals m5g(1) and m5g(2) of the fifth transistors in the shift register units RS(1) and RS(2) are also shown.

It can be seen that the (2n+1)-th shift register unit operates in accordance with the timing shown in FIG. 9, and the (2n+2)-th shift register unit operates in accordance with the timing shown in FIG. 8.

In practice, the last two shift register units in the gate driving circuit may be dummy in that the gate scan signals output by them are not utilized. In some embodiments, the reset input terminal RST of the (N−1)-th shift register unit and the carry input terminal CRn+1 of the N-th shift register unit may be configured to receive the initialization signal stv0, and the reset input terminal RST of the N-th shift register unit may be configured to receive the frame start pulse signal stv1.

Figure 12:
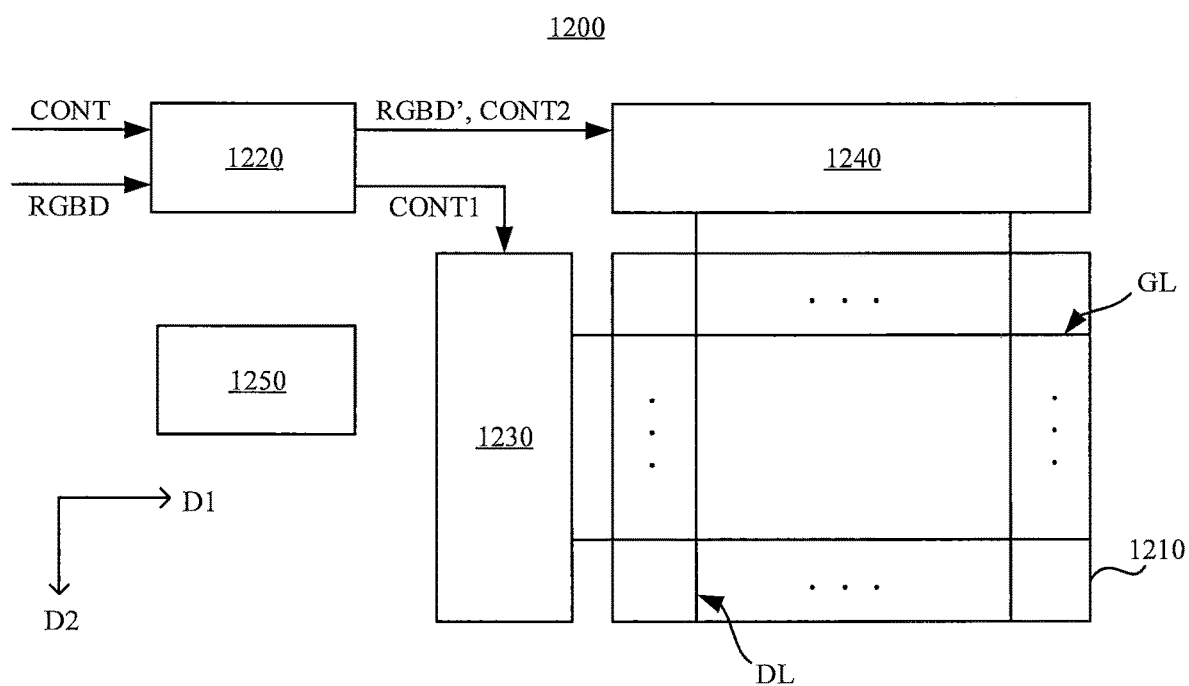
FIG. 12 is a schematic block diagram of a display device in accordance with an embodiment of the present disclosure.

FIG. 12 is a schematic block diagram of a display device in accordance with an embodiment of the present disclosure.

Referring to FIG. 12, the display device 1200 includes a display panel 1210, a timing controller 1220, a gate driver 1230, a data driver 1240, and a voltage generator 1250. The gate driver 1230 may take the form of the gate driving circuit embodiment described above with respect to FIGS. 10 and 11.

The display panel 1210 is connected to a plurality of gate lines GL extending in a first direction D1 and a plurality of data lines DL extending in a second direction D2 crossing (e.g., substantially perpendicular) to the first direction D1. The display panel 1210 includes a plurality of pixels (not shown) arranged in a matrix form. Each of the pixels may be electrically connected to a corresponding one of the gate lines GL and a corresponding one of the data lines DL. The display panel 1210 can be a liquid crystal display panel, an organic light emitting diode (OLED) display panel, or any other suitable type of display panel.

The timing controller 1220 controls the operations of the display panel 1210, the gate driver 1230, the data driver 1240, and the voltage generator 1250. The timing controller 1220 receives input image data RGBD and input control signals CONT from a system interface. The input image data RGBD may include a plurality of input pixel data for the plurality of pixels. Each of the input pixel data may include red gradation data R, green gradation data G, and blue gradation data B for a respective one of the plurality of pixels. The input control signals CONT may include a main clock signal, a data enable signal, a vertical sync signal, a horizontal sync signal, and the like. The timing controller 1220 generates output image data RGBD', first control signals CONT1, and second control signals CONT2 based on the input image data RGBD and the input control signals CONT.

The timing controller 1220 can be implemented in a number of ways (e.g., using dedicated hardware) to perform the various functions discussed herein. A "processor" is an example of the timing controller 1220 that employs one or more microprocessors that can be programmed using software (e.g., microcode) to perform the various functions discussed herein. The timing controller 1220 can be implemented with or without a processor, and can also be implemented as a combination of dedicated hardware that performs some functions and a processor that performs other functions. Examples of the timing controller 1220 include, but are not limited to, conventional microprocessors, application specific integrated circuits (ASICs), and field programmable gate arrays (FPGAs).

The gate driver 1230 receives the first control signals CONT1 from the timing controller 1220. The first control signals CONT1 may include the initialization signal stv0, the frame start pulse signal stv1, and the first, second, third, and fourth clock signals clk1, clk2, clk3, and clk4 shown in FIGS. 10 and 11. The gate driver 1230 generates a plurality of gate driving signals for output to the gate lines GL based on the first control signals CONT1. The gate driver 1230 may sequentially apply the plurality of gate driving signals to the gate lines GL.

The data driver 1240 receives the second control signals CONT2 and the output image data RGBD' from the timing controller 1220. The data driver 1240 generates a plurality of data voltages based on the second control signals CONT2 and the output image data RGBD'. The data driver 1240 may apply the generated plurality of data voltages to the data lines DL.

The voltage generator 1250 supplies power to the display panel 1210, the timing controller 1220, the gate driver 1230, the data driver 1240, and potentially additional components. Specifically, the voltage generator 1250 is configured to supply the first, second, third, and fourth voltage signals v1, v2, v3, and v4 shown in FIG. 10 under the control of the timing controller 1220. In one implementation, the voltage generator 1250 may include a voltage converter such as a DC/DC converter.

In embodiments, the gate driver 1230 and/or the data driver 1240 may be disposed on the display panel 1210 or may be coupled to the display panel 1210 by, for example, a Tape Carrier Package (TCP). In one example, the gate driver 1230 can be integrated in the display panel 1210 as a gate driver on array (GOA) circuit.

Examples of the display device 1200 include, but are not limited to, mobile phones, tablets, televisions, displays, notebook computers, digital photo frames, navigators.

Variations to the disclosed embodiments can be understood and effected by the skilled person in practicing the claimed subject matter, from a study of the drawings, the disclosure, and the appended claims. In the claims, the word "comprises" or "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A shift register unit, comprising:
   a signal input terminal configured to receive an input signal;
   a reset input terminal configured to receive a reset signal;
   a carry input terminal configured to receive a carry input signal;
   a clock signal terminal configured to receive a clock signal;
   a signal output terminal configured to output an output signal;
   a carry output terminal configured to output a carry output signal;
   a first voltage terminal configured to receive an inactive voltage;
   a second voltage terminal configured to receive an inactive voltage;
   a first output circuit configured to transfer the clock signal at the clock signal terminal to the signal output terminal as the output signal in response to a first node being at an active potential, wherein the first node is configured to be at the active potential in response to the input signal at the signal input terminal being active and to be at an inactive potential in response to the reset signal at the reset input terminal being active;
   a second output circuit configured to transfer the clock signal at the clock signal terminal to the carry output terminal as the carry output signal in response to the first node being at the active potential; and a delay circuit configured to generate a delayed version of the carry input signal in response to the carry input signal at the carry input terminal being active, and to transfer the inactive voltage at the first voltage terminal to the signal output terminal in response to the delayed version of the carry input signal being active.

2. The shift register unit of claim 1, further comprising:
a first input circuit configured to transfer the input signal at the signal input terminal to the first node in response to the input signal being active; and
a second input circuit configured to transfer the inactive voltage at the second voltage terminal to the first node in response to the reset signal at the reset input terminal being active.

3. The shift register unit of claim 2, wherein the first input circuit comprises:
a sixth transistor comprising a gate connected to the signal input terminal, a first electrode connected to the signal input terminal, and a second electrode connected to the first node.

4. The shift register unit of claim 2, wherein the second input circuit comprises:
a seventh transistor comprising a gate connected to the reset input terminal, a first electrode connected to the first node, and a second electrode connected to the second voltage terminal.

5. The shift register unit of claim 1, further comprising:
an initialization signal terminal configured to receive an initialization signal; and
an initialization circuit configured to transfer the inactive voltage at the second voltage terminal to the first node in response to the initialization signal at the initialization signal terminal being active.

6. The shift register unit of claim 5, wherein the initialization circuit comprises:
an eighth transistor comprising a gate connected to the initialization signal terminal, a first electrode connected to the first node, and a second electrode connected to the second voltage terminal.

7. The shift register unit of claim 1, further comprising:
a reset circuit configured to transfer the inactive voltage at the first voltage terminal to the signal output terminal in response to the reset signal at the reset input terminal being active.

8. The shift register unit of claim 7, wherein the reset circuit comprises:
a ninth transistor comprising a gate connected to the reset input terminal, a first electrode connected to the signal output terminal, and a second electrode connected to the first voltage terminal.

9. The shift register unit of claim 1, further comprising:
a third voltage terminal configured to receive a first voltage signal;
a first node control circuit configured to set a potential at a second node based upon a potential at the first node, the first voltage signal at the third voltage terminal, and the inactive voltage at the second voltage terminal;
a first voltage pull circuit configured to transfer the inactive voltage at the first voltage terminal to the signal output terminal in response to the potential at the second node being active; and
a second voltage pull circuit configured to transfer the inactive voltage at the second voltage terminal to the carry output terminal in response to the potential at the second node being active.

10. The shift register unit of claim 9, further comprising:
a first noise reduction circuit configured to transfer the inactive voltage at the second voltage terminal to the first node in response to the potential at the second node being active.

11. The shift register unit of claim 9, further comprising:
a fourth voltage terminal configured to receive a second voltage signal;
a second node control circuit configured to set a potential at a third node depending upon the potential at the first node, the second voltage signal at the fourth voltage terminal, and the inactive voltage at the second voltage terminal;
a third voltage pull circuit configured to transfer the inactive voltage at the first voltage terminal to the signal output terminal in response to the potential at the third node being active; and
a fourth voltage pull circuit configured to transfer the inactive voltage at the second voltage terminal to the carry output terminal in response to the potential at the third node being active.

12. The shift register unit of claim 11, further comprising:
a second noise reduction circuit configured to transfer the inactive voltage at the second voltage terminal to the first node in response to the potential at the third node being active.

13. The shift register unit of claim 11,
wherein the second node control circuit comprises a seventeenth transistor, an eighteenth transistor, a nineteenth transistor, and a twentieth transistor,
wherein the seventeenth transistor comprises a gate connected to the fourth voltage terminal, a first electrode connected to the fourth voltage terminal, and a second electrode connected to a gate of the eighteenth transistor,
wherein the eighteenth transistor comprises a gate connected to the second electrode of the seventeenth transistor, a first electrode connected to the fourth voltage terminal, and a second electrode connected to the third node,
wherein the nineteenth transistor comprises a gate connected to the first node, a first electrode connected to the gate of the eighteenth transistor, and a second electrode connected to the second voltage terminal,
wherein the twentieth transistor comprises a gate connected to the first node, a first electrode connected to the third node, and a second electrode connected to the second voltage terminal,
wherein the third voltage pull circuit comprises a twenty-first transistor comprising a gate connected to the third node, a first electrode connected to the signal output terminal, and a second electrode connected to the first voltage terminal, and
wherein the fourth voltage pull circuit comprises a twenty-second transistor comprising a gate connected to the third node, a first electrode connected to the carry output terminal, and a second electrode connected to the second voltage terminal.

14. The shift register unit of claim 9,
wherein the first node control circuit comprises a tenth transistor, an eleventh transistor, a twelfth transistor, and a thirteenth transistor,
wherein the tenth transistor comprises a gate connected to the third voltage terminal, a first electrode connected to the third voltage terminal, and a second electrode connected to a gate of the eleventh transistor, wherein the eleventh transistor comprises a gate connected to the second electrode of the tenth transistor, a first electrode connected to the third voltage terminal, and a second electrode connected to the second node, wherein the twelfth transistor comprises a gate connected to the first node, a first electrode connected to the gate of the eleventh transistor, and a second electrode connected to the second voltage terminal, wherein the thirteenth transistor comprises a gate connected to the first node, a first electrode connected to the second node, and a second electrode connected to the second voltage terminal, wherein the first voltage pull circuit comprises a fourteenth transistor comprising a gate connected to the second node, a first electrode connected to the signal output terminal, and a second electrode connected to the first voltage terminal, and wherein the second voltage pull circuit comprises a fifteenth transistor comprising a gate connected to the second node, a first electrode connected to the carry output terminal, and a second electrode connected to the second voltage terminal.

15. The shift register unit of claim 1, wherein the first output circuit comprises:

a first transistor comprising a gate connected to the first node, a first electrode connected to the clock signal terminal, and a second electrode connected to the signal output terminal; and a storage capacitor comprising a first terminal connected to the first node and a second terminal connected to the signal output terminal.

16. The shift register unit of claim 1, wherein the second output circuit comprises:

a second transistor comprising a gate connected to the first node, a first electrode connected to the clock signal terminal, and a second electrode connected to the carry output terminal.

17. The shift register unit of claim 1, wherein the delay circuit comprises a third transistor, a fourth transistor and a fifth transistor, wherein the third transistor comprises a gate connected to the carry input terminal, a first electrode connected to a gate of the fourth transistor, and a second electrode connected to the carry input terminal, wherein the fourth transistor comprises a gate connected to the first electrode of the third transistor, a first electrode connected to a gate of the fifth transistor, and a second electrode connected to the carry input terminal, and wherein the fifth transistor comprises a gate connected to the first electrode of the fourth transistor, a first electrode connected to the signal output terminal, and a second electrode connected to the first voltage terminal.

18. A gate driving circuit comprising N shift register units as recited in claim 1 that are cascaded with each other, N being an integer greater than or equal to 4, wherein signal input terminals of a first one and a second one of the N shift register units are configured to receive a frame start pulse signal as the input signal, wherein the carry output terminal and the reset input terminal of an i-th one of the N shift register units are respectively connected to the signal input terminal and the carry output terminal of an (i+2)-th one of the N shift register units, i being an integer, 1≤i≤N−2, and wherein the carry input terminal of a j-th one of the N shift register units is connected to the carry output terminal of a (j+1)-th one of the N shift register units, j being an integer, 1≤j≤N−1.

19. A display device comprising the gate driving circuit of claim 18.

* * * * *